(12) United States Patent
Ano (10) Patent No.: US 6,977,443 B2
(45) Date of Patent: Dec. 20, 2005

(54) SUBSTRATE FOR CARRYING A SEMICONDUCTOR CHIP AND SEMICONDUCTOR DEVICE USING SAME

(75) Inventor: Kazuaki Ano, Hayami-gun (JP)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 10/225,006

(22) Filed: Aug. 21, 2002

(65) Prior Publication Data

US 2003/0042586 A1    Mar. 6, 2003

(30) Foreign Application Priority Data

Aug. 21, 2001    (JP)    .............................. 2001-249908

(51) Int. Cl.[7] ........................................... H01L 23/48
(52) U.S. Cl. ..................... 257/786; 257/778; 257/784
(58) Field of Search ................................ 257/690, 692, 257/739, 773, 775, 778, 780, 781, 784, 786; 438/108, 612, 614, 617, 618, 638, 666

(56) References Cited

U.S. PATENT DOCUMENTS 5,731,709 A * 3/1998 Pastore et al. .............. 324/760
6,596,561 B2 * 7/2003 Takahashi et al. .......... 438/113

* cited by examiner

Primary Examiner—Hung Vu
(74) Attorney, Agent, or Firm—Yingsheng Tung; Wade James Brady, III; Frederick J. Telecky, Jr.

(57) ABSTRACT

The objective of this invention is to provide a type of substrate for carrying a semiconductor chip that can increase the arrangement density of lands, and a type of semiconductor device that makes use of said substrate for carrying a semiconductor chip. Constitution: The conductor pattern on insulating substrate 102 contains lands 130 that are respectively connected to electrode pads 120 of semiconductor chip 100 via conductor wires 110. Each land 130 of conductor pattern 110 as capillary tool contact portion 202 where the capillary tool makes contact during bonding, and wire contact portion 204 that allows contact of conductor wire 110. The portion of wire contact portion 204 on the side toward capillary tool contact portion 202 becomes constricted portion 200. Lands 130 are positioned such that constricted portion 200 and capillary tool contact portion 202 of adjacent lands 130 are arranged facing each other.

5 Claims, 7 Drawing Sheets

SUBSTRATE FOR CARRYING A SEMICONDUCTOR CHIP AND SEMICONDUCTOR DEVICE USING SAME

FIELD OF THE INVENTION

This invention pertains to a type of substrate for carrying a semiconductor chip used in a semiconductor package or other semiconductor device, as well as a type of semiconductor device having said substrate for carrying a semiconductor.

This application claims priority from Japanese patent application number 13(2001)-249908, filed Aug. 21, 2001.

BACKGROUND OF THE INVENTION

Figure 10:
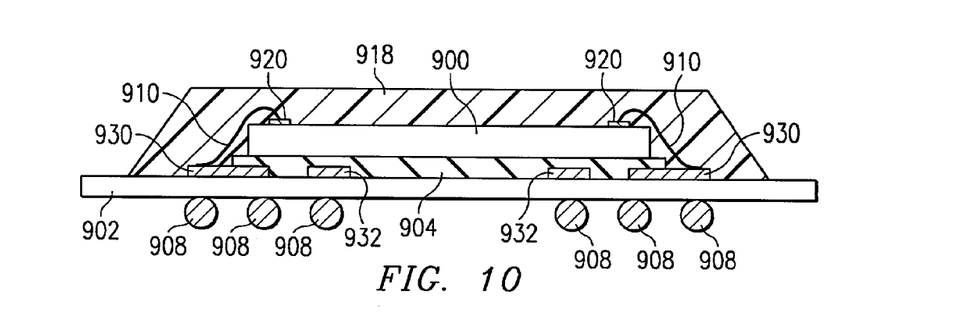
FIG. 10 is a diagram illustrating schematically the basic constitution of a conventional semiconductor package.

In recent years, with progress in miniaturization and performance upgrades of electronic information equipment, great efforts have been made to develop technology for increasing the density of semiconductor packages and of other semiconductor devices mounted on them. The BGA (Ball Grid Array) structure is a structure for increasing the density of semiconductor packages. FIG. 10 is a diagram illustrating an example of the basic constitution of a semiconductor package adopting a BGA structure. In this semiconductor package, semiconductor chip 900 having an integrated circuit formed on its principal surface (upper surface shown in the figure) is attached via die bonding paste 904 to insulating substrate (substrate) 902, and is sealed with sealant 918. Electrode pads 920 led out from the integrated circuit are formed on the surface of semiconductor chip 900. A conductor pattern is formed on the principal surface of insulating substrate 902 for connecting electrode pads 920 of semiconductor chip 900 to solder bumps 908 serving as external connecting terminals. This conductor pattern includes lands 930 that are connected to electrode pads 920 of semiconductor chip 900 via conductor wires 910, and connecting pads 932 connected to solder bumps 908 via through holes formed in insulating substrate 902.

Figure 11:
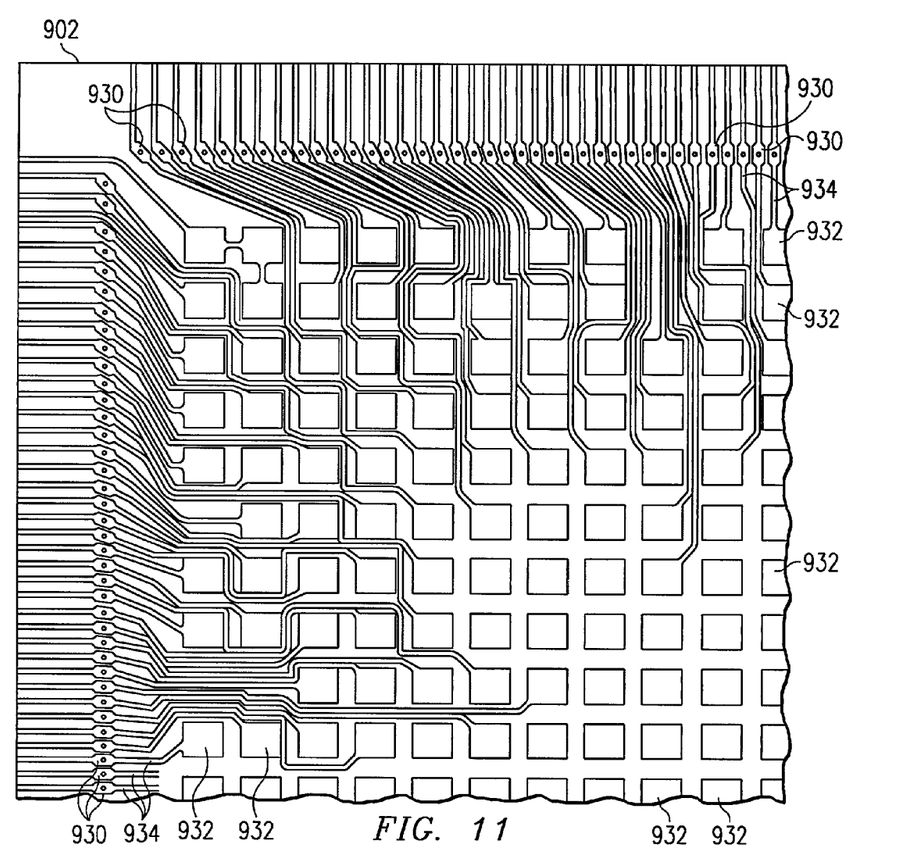
FIG. 11 is a plan view illustrating the conductor pattern on the insulating substrate of the conventional semiconductor package shown in FIG. 10.
Figure 12:
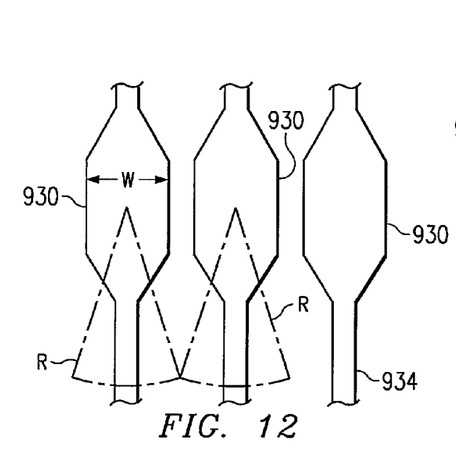
FIG. 12 is an enlarged plan view illustrating the shape of the lands of the conventional semiconductor package shown in FIG. 10.

FIG. 11 is a plan view illustrating the conductor pattern on insulating substrate 902. Lands 930 of the conductor pattern are arranged along the outer periphery of semiconductor chip 100 assembled on insulating substrate 902. Connecting pads 932 are arranged 2-dimensionally in the inner region of insulating substrate 902. Lands 930 and connecting pads 932 are connected to each other by means of leads 934. As shown in FIG. 12, an enlarged plan view, each land 930 has a rectangular planar shape with a constant width W (about 0.1 mm). Conductor wire 910 is bonded to its surface.

In recent years, in order to meet the requirements for higher density of semiconductor packages, there has been demand for an increase in the number of pins without a change in the package size. For this purpose, it is necessary to reduce the arrangement pitch of lands 930 in order to increase the arrangement density. However, when the arrangement pitch of lands 930 is reduced, the following problems arise.

That is, because each land 930 has an area (wire connection enablement area R) that allows conductor wire 910 to be connected during bonding, it is necessary to ensure that said wire connection enablement areas R do not overlap each other in order to prevent mutual contact between conductor wires 910. It is known that said wire connection enablement areas R have a fan shape with radius of 0.25 mm and fan angle of 30° C. Consequently, in order to preserve such areas, it is necessary to have an arrangement pitch for lands 930 of about 0.13 mm or larger.

Figure 13:
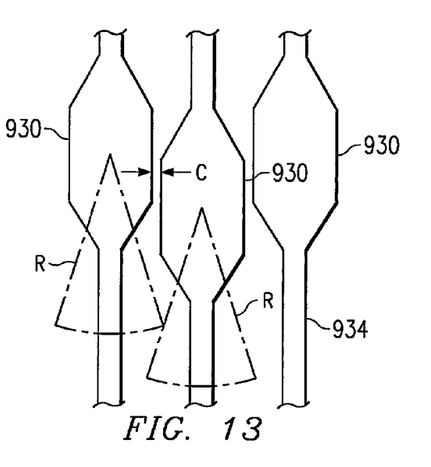
FIG. 13 is a plan view illustrating another arrangement example of the lands of the conventional semiconductor package shown in FIG. 12.

On the other hand, in order to preserve wire connection enablement areas R, a zigzag configuration has been proposed, as shown in FIG. 13, in which lands 930 are arranged offset from each other alternately toward the outer side and toward the inner side of insulating substrate 902 (FIG. 11). However, in this case, gap C between lands 930 becomes too narrow, and manufacturing becomes difficult using the present available etching process capability (which requires a gap of 30 μm or larger). This is undesirable.

The purpose of this invention is to solve the aforementioned problems of the conventional methods by providing a type of substrate for carrying a semiconductor chip that can increase the arrangement density of lands, and a type of semiconductor device using said substrate for carrying a semiconductor chip.

SUMMARY OF INVENTION

In order to realize the aforementioned purpose, this invention provides a type of substrate for carrying a semiconductor chip characterized by the following facts: the substrate for carrying a semiconductor chip has an insulating substrate having a semiconductor chip-carrying region on its principal surface, and plural conductor patterns which are formed on the principal surface of said insulating substrate, and each of these has a nearly rectangular land connected to a conductor wire extending from an electrode pad of the mounted semiconductor chip, a pad connected to an electrode as an external connecting terminal, and a lead that connects said land and said pad; said land has a constricted portion that is formed in the central area of the land and has a width smaller than that of the remaining region, and a capillary tool contact portion where the capillary tool makes contact during connection of said conductor wire and where said conductor wire is mechanically connected, and, said lands are arranged along the outer periphery of said semiconductor chip-carrying region such that their longitudinal direction is nearly in line with the corresponding electrode pads of the mounted semiconductor chip; adjacent lands are arranged such that said capillary tool contact portion and said constricted portion face each other.

In this way, because the constricted portion and capillary tool contact portion of the adjacent lands are arranged facing each other, the required gap between adjacent lands (the gap needed to enable etching processing) is guaranteed, and the region for preventing mutual contact between conductor wires is preserved, while the arrangement pitch of the lands can be reduced. As a result, it is possible to reduce the arrangement pitch and to increase the arrangement density of the lands.

Also, according to this invention, it is preferred that the longitudinal direction of said lands be orthogonal to the direction of arrangement of said plural lands, and said lands be arranged offset from each other in the direction orthogonal to said arrangement direction.

Also, according to this invention, it is preferred that the longitudinal directions of said lands be nearly radially arranged with respect to the central portion of said semiconductor chip-carrying region.

Also, according to this invention, it is preferred that with said constricted portion sandwiched between them, the wire contact portion formed at a position corresponding to said capillary tool contact portion and said capillary tool contact portion be nearly in round shape.

Also, according to this invention, it is preferred that the width of said constricted portion be 25%–75% the width of said capillary tool contact portion.

Also, this invention provides a type of semiconductor device having the following parts: the aforementioned substrate for carrying a semiconductor chip, a semiconductor chip that has plural electrode pads on its principal surface and is carried on the semiconductor chip-carrying region of said substrate for carrying a semiconductor chip, plural conductor wires that connect said electrode pads and the lands of said substrate for carrying a semiconductor chip, respectively, and a sealant that seals said conductor wires and said semiconductor chip.

REFERENCE NUMERALS AND SYMBOLS AS SHOWN IN THE DRAWINGS

In the figures, 100 represents a semiconductor chip, 102 an insulating substrate, 104 a die bonding paste, 108 a solder bump, 110 a conductor wire, 118 a sealant, 120 an electrode pad, 130, a land, 132 a connecting pad, 200 a constricted portion, 202, 204 a principal portion, 300 a through hole, 400 a capillary tool, 402 an extremely fine wire

DESCRIPTION OF THE EMBODIMENT

Figure 1:
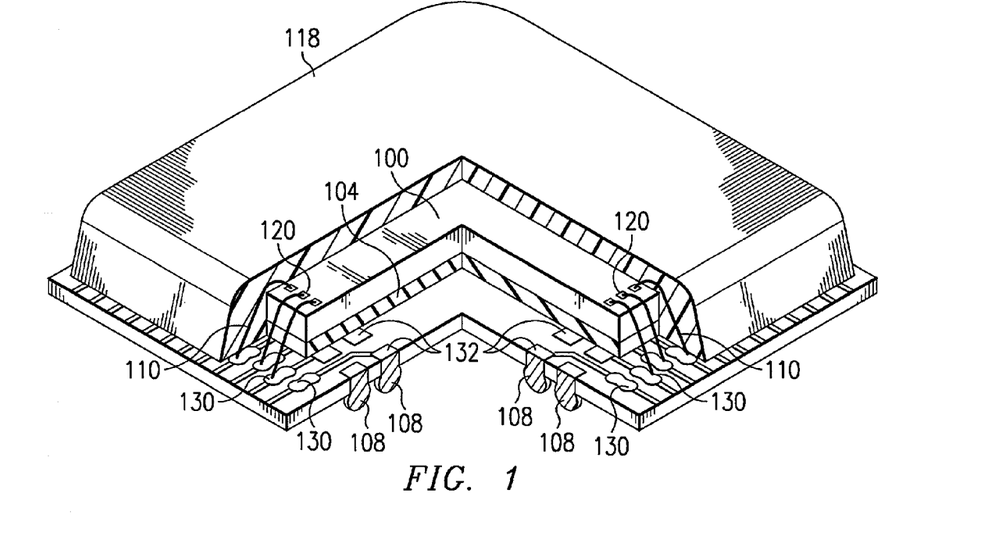
FIG. 1 is a partially cutaway oblique side view of the semiconductor package in Embodiment 1 of this invention.
Figure 2:
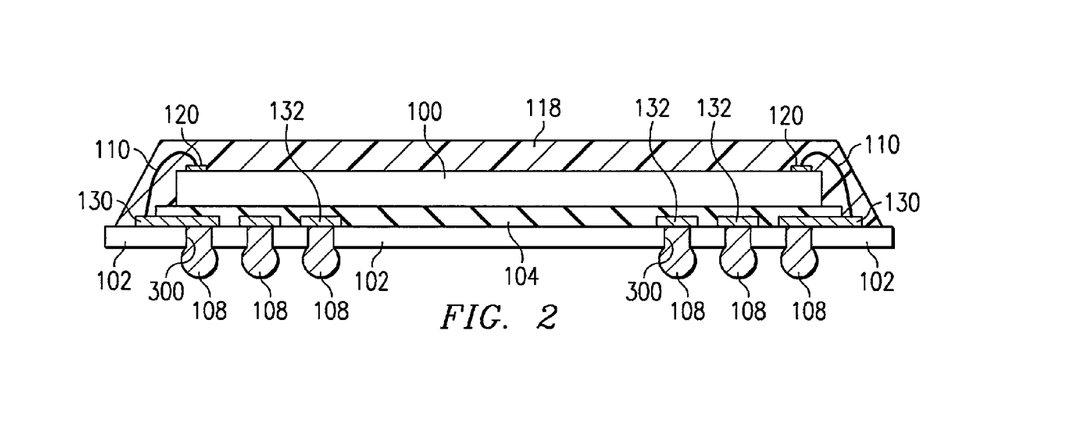
FIG. 2 is a side cross section of the semiconductor package shown in FIG. 1.

In the following, an embodiment of this invention will be explained with reference to figures. FIGS. 1 and 2 are a partially cutaway oblique view and a side cross section of the semiconductor package in this invention, respectively. For the semiconductor package in this embodiment, semiconductor chip 100 is attached by means of die bonding paste 104 to insulating substrate 102, and is sealed with sealant 118. For semiconductor chip 100, an integrated circuit not shown in the figure is formed on one side of a silicon substrate, and the other side is attached to insulating substrate 102. Plural electrode pads 120 led out from the integrated circuit are arranged on the outer periphery of the surface of semiconductor chip 100 on the integrated circuit side.

Insulating substrate 102 is a substrate made of polyimide or ceramics. On the surface of insulating substrate 102 (the surface on the side toward semiconductor chip 100), a conductor pattern is formed for making electrical connections between electrode pads 120 of semiconductor chip 100 and solder bumps 108 serving as external connecting terminals. This conductor pattern formed on insulating substrate 102 is made of copper or the like, and it includes lands 130 that are connected via conductor wires 110 to electrode pads 120 of semiconductor chip 100, and connecting pads 132 connected via through holes in insulating substrate 102 to solder bumps 108. Lands 130 are arranged along the outer periphery of semiconductor chip 100 assembled on insulating substrate 102, and connecting pads 132 are arranged in a 2-dimensional configuration on the inner side of insulating substrate 102.

Figure 3:
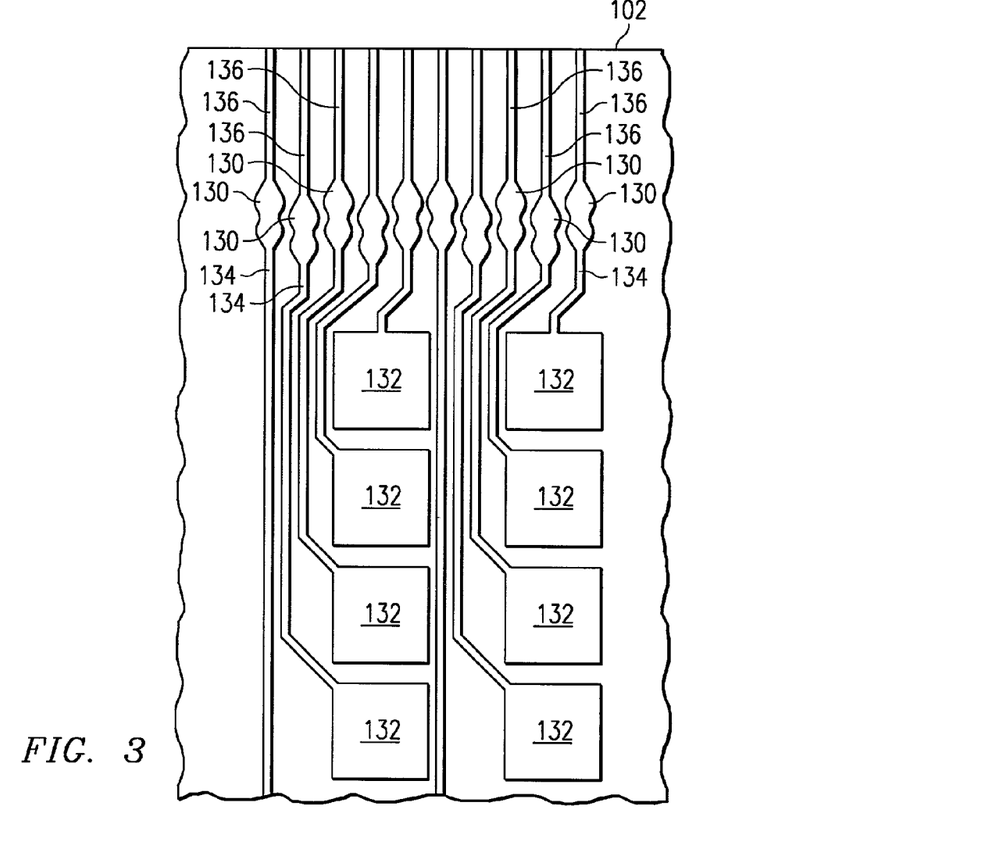
FIG. 3 is a plan view illustrating the conductor pattern of the semiconductor package shown in FIG. 1.

FIG. 3 is an enlarged plan view of the conductor pattern on insulating substrate 102. The conductor pattern on insulating substrate 102 also has leads 134, 136 as pattern portions of smaller width than that of lands 130. Leads 134 are for electrical connections between paired lands 130 and connecting pads 132, respectively. Leads 136 are used as, for example, test terminals, in certain steps of the manufacturing process.

Figure 4:
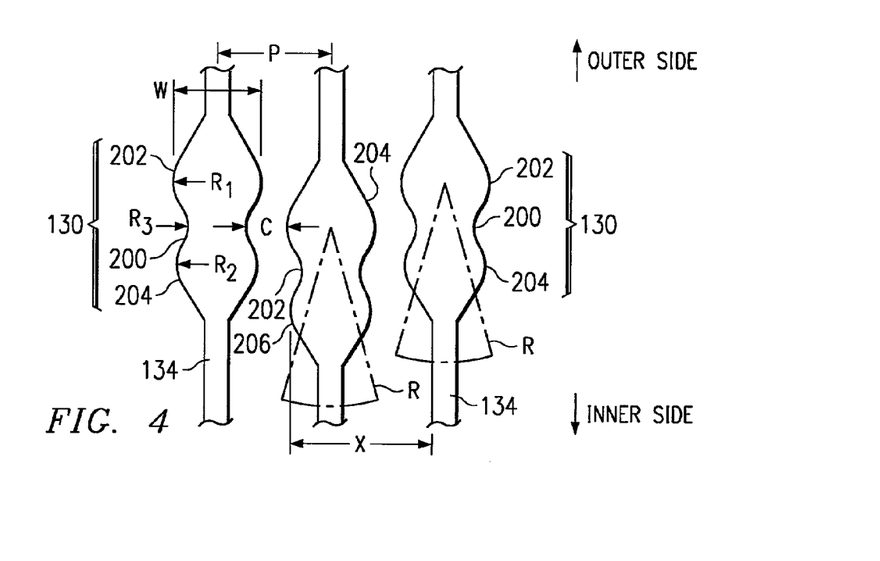
FIG. 4 is a plan view illustrating the planar shape of the lands of the semiconductor package shown in FIG. 1.

FIG. 4 is an enlarged plan view illustrating the planar shape of lands 130. Lands 130 are arranged as longitudinal members extending in the direction orthogonal to their arrangement direction (X-direction). The longitudinal direction of said lands 130 is nearly the same as the direction in which conductor wires 110 extend from their respective electrode pads 120 of semiconductor chip 100, (see FIG. 1). The region on the outer side of land 130 (the side nearer to the outer periphery of insulating substrate 102) becomes capillary tool contact portion 202 where the capillary tool (to be explained later) makes contact in the operational step of bonding conductor wires 110. In the bonding operational step, said capillary tool contact portion 202 is the portion where one end of wiring conductor 110 is permanently attached. Also, the region on the inner side of land 130 (the side nearer to semiconductor chip 100) becomes wire contact portion 204 that allows contact of conductor wire 110 in the operational step of bonding conductor wire 110. This wire contact portion 204 is the portion that temporarily supports conductor wire 110 during the bonding operational step. Both capillary tool contact portion 202 and wire contact portion 204 have a nearly round planar shape. In addition, the region of wire contact portion 204 on the side toward capillary tool contact portion 202 becomes constricted portion 200 with a width smaller than that of capillary tool contact portion 202. This constricted portion 200 that connects capillary tool contact portion 202 and wire contact portion 204 has a concave curved [peripheral] surface. All of said constricted portion 200, capillary tool contact portion 202 and wire contact portion 204 that form land 130 have a dipper shape. In a preferred embodiment, width W of capillary tool contact portion 202 is 0.1 mm, and the distance between centers of the capillary tool contact portion 202 and wire contact portion 204 is 0.15 mm. Also, it is preferred that the width of constricted portion 200 be in the range of 25%–75% the width of capillary tool contact portion 202.

On insulating substrate 102, the area that enables connection of conductor wire 110 during the bonding operational step (wire connection enablement area) indicated by R in the figure may be, for example, a fan-shaped area with a radius of 0.25 mm and a fan angle of 30°. Lands 130 are arranged offset alternately from each other in the direction orthogonal to the arrangement direction (indicated by arrow X in the figure), and they are arranged such that wire connection enablement areas R do not overlap each other, and constricted portion 200 and capillary tool contact portion 202 of adjacent lands 130 are arranged facing each other. In this arrangement, it is possible to prevent mutual contact between conductor wires 110, and to reduce the arrangement pitch while gap C between lands 130 is maintained at 30 μm or more, the gap that allows etching.

In addition, radius of curvature R3 of the outer periphery (concave curved surface) of constricted portion 200 is configured to be nearly equal to radius R1 of capillary tool contact portion 202 (convex curved surface). In this way, it is possible to maintain a constant spacing for the gap between capillary tool contact portion 202 and constricted portion 200. Also, radius R2 of wire contact portion 204 is configured to be a little smaller than radius R1 of capillary tool contact portion 202. As a preferred embodiment, when width W of capillary tool contact portion 202 is 0.1 mm (that is, when radius R1 is 0.05 mm), it is possible to have an arrangement pitch P of lands 130 of 0.122 mm.

Figure 5:
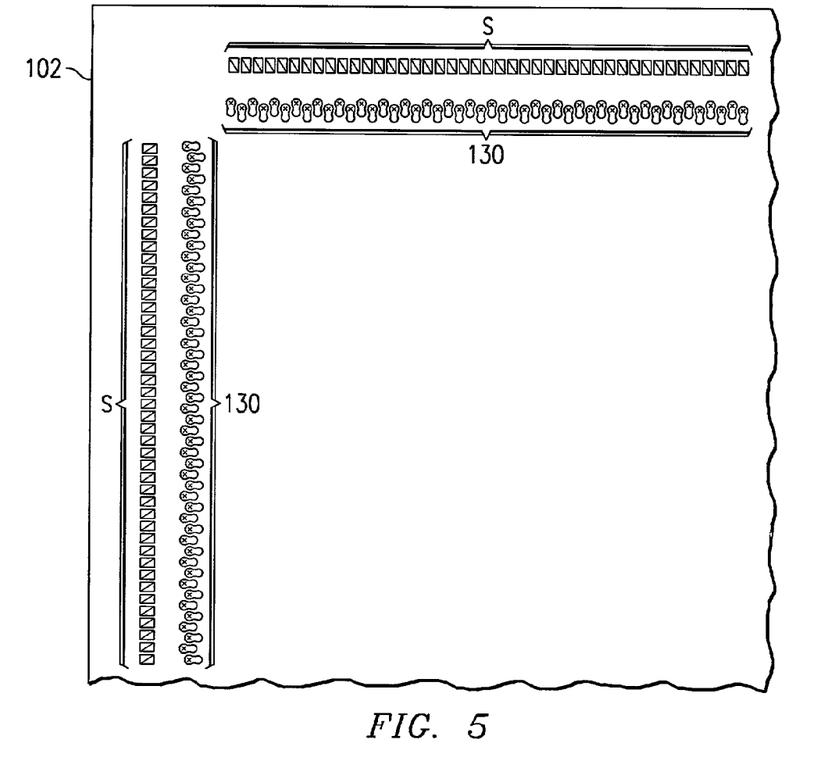
FIG. 5 is a plan view illustrating the arrangement pattern of the lands shown in FIG. 4.

FIG. 5 is a diagram illustrating an example of the arrangement of lands 130 pertaining to this form of this embodiment. It corresponds to a region of about a quarter of the surface of insulating substrate 102. In this form of the embodiment, when lands 130 with a width of 0.1 mm are arranged along the outer periphery of a square semiconductor chip 100 with each edge 13 mm long (not shown in FIG. 5), the number of lands that can be provided is 380 (95 lands for each edge). As a comparison, FIG. 5 also shows an example in which lands S (with a width of 0.1 mm) that do not have the constricted portion 200 of lands 130 are arranged on the periphery of semiconductor chip 100 with the aforementioned dimensions. In this case, the number of lands that can be arranged along the outer periphery of semiconductor chip 100 becomes 340 (85 lands on each edge). That is, when this form of the embodiment is adopted for the semiconductor package containing semiconductor chip 100 with said dimensions, it is possible to increase the number of the lands that can be provided by 40, and it is thus possible to increase the number of pins of the semiconductor package.

Figure 6A:
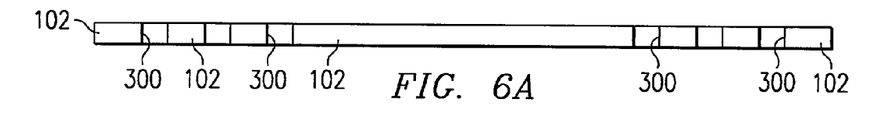
FIG. 6 is a cross section illustrating the steps for manufacturing the semiconductor package shown in FIG. 1.
Figure 6B:
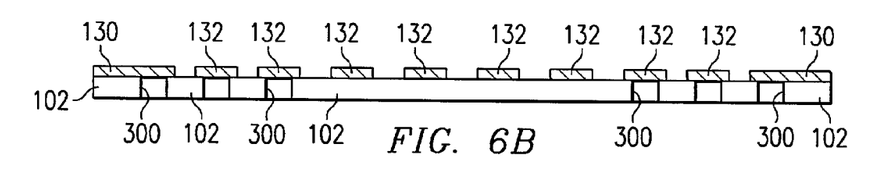
Figure 6C:
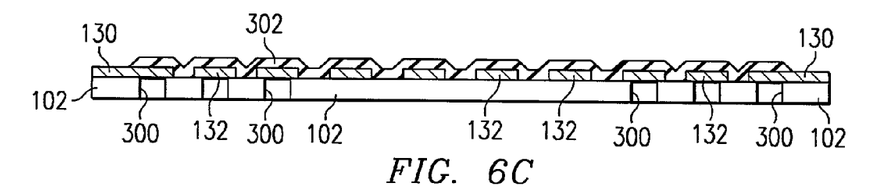
Figure 6D:
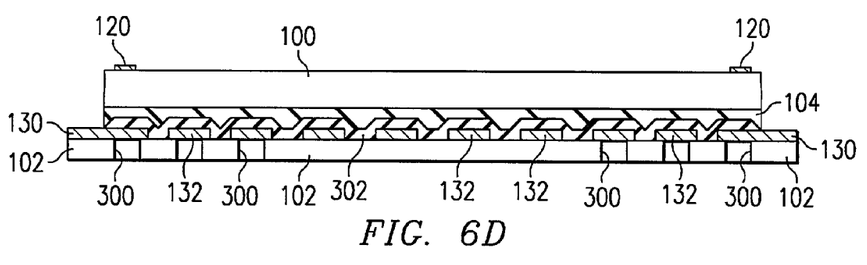

In the following, we will examine the method for manufacturing the semiconductor package pertaining to this form of said embodiment, with reference to FIG. 6. First of all, as shown in FIG. 6(A), through holes 300 are formed in insulating substrate 102 made of polyimide or ceramics. Formation of said through holes 300 may be effected by punching processing using a punching tool, or by means of photolithography. After copper foil is laminated on the entire surface of said insulating substrate 102 with through holes 300 formed in it, etching is performed by means of photolithography to form lands 130 and connecting pads 132 shown in FIG. 6(B). Then, as shown in FIG. 6(C), the portions that become lands 130 are left exposed on the surface of insulating substrate 102 when solder mask 302 is applied. Nickel or gold plating is performed on said exposed lands 130. Then, using a dispenser (not shown in the figure), die bonding paste 104 made of an epoxy resin is applied dropwise on insulating substrate 102. Before curing of the liquid die bonding paste 104, semiconductor chip 100 manufactured in another process is pressed down with a prescribed pressure, as shown in FIG. 6(D), and die bonding paste 104 is distributed over the entire area beneath semiconductor chip 100. In this state, die bonding paste 104 is cured when the atmospheric temperature is raised by means of a heater or the like, and semiconductor chip 100 is attached to insulating substrate 102.

Figure 6E:
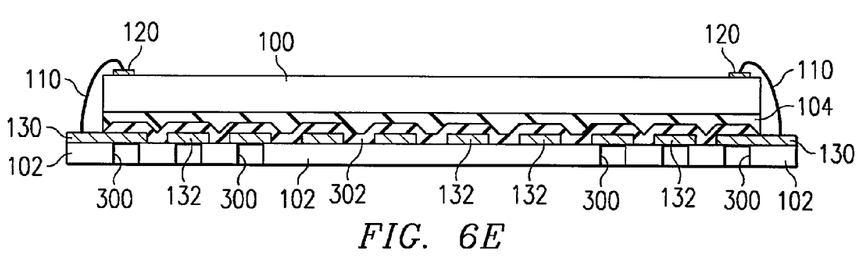
Figure 7A:
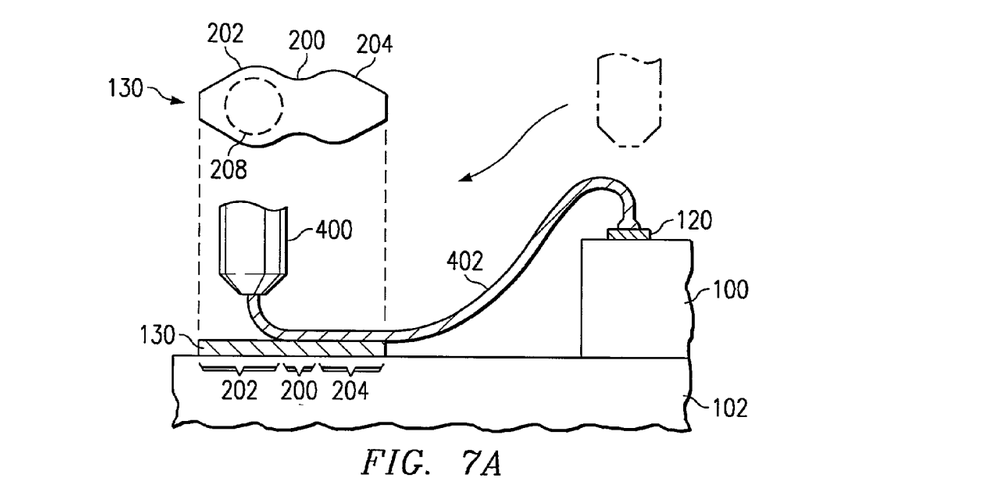
FIG. 7 is a cross section illustrating the bonding operation in the manufacturing process shown in FIG. 6.
Figure 7B:
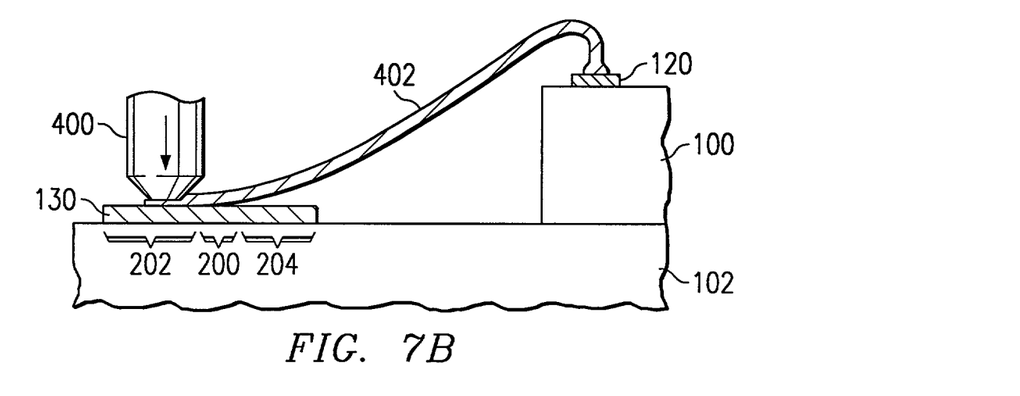

Then, as shown in FIG. 6(E), electrode pads 120 of semiconductor chip 100 and lands 130 are respectively bonded to each other by means of conductor wires 110. FIG. 7 is a schematic diagram illustrating this bonding operation. In the bonding operation, capillary tool 400 is used that feeds an extremely fine wire of gold or aluminum in a softened state. First of all, one end of extremely fine wire 402 ejected from capillary tool 400 is bonded to electrode pad 120 of semiconductor chip 100. Then, as shown in FIG. 7(A), said extremely fine wire 402 is pulled to extend it while describing a loop, and it is bonded to land 130 on insulating substrate 102. During bonding to land 130, capillary tool 400 is located above the central position 208 of capillary tool contact portion 202 of land 130. In this situation, extremely fine wire 402 is supported by wire contact portion 204 of land 130. Then, as shown in FIG. 7(B), capillary tool 400 is pushed downward (towards capillary tool contact portion 202), and the portion of the tip side of extremely fine wire 402 makes contact with capillary tool contact portion 202, and it is secured there. Accompanying this operation, the portion of extremely fine wire 402 in contact with wire contact portion 204 floats off wire contact portion 204 a little. Capillary tool 400 is lifted up in this state, and capillary tool 400 is housed above said land 130. The tip of extremely fine wire 402 is left attached to capillary tool contact portion 202 of land 130. As a result, bonding between electrode pad 120 of semiconductor chip 100 and land 130 is completed, and bonded extremely fine wire 402 becomes conductor wire 110.

Figure 6F:
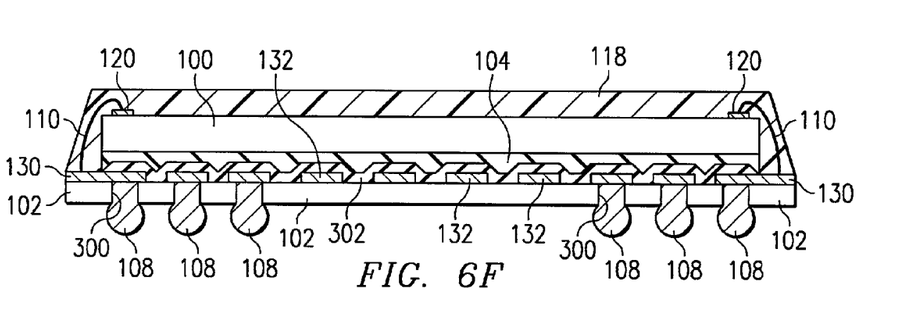

After completion of bonding between electrode pad 120 and land 130, semiconductor chip 100 is sealed with sealant 118 made of a mold resin, as shown in FIG. 6(F). Finally, the interior of each through hole 300 in insulating substrate 102 is filled with solder paste to form solder bump 108. After said operational steps, a semiconductor package is completed.

As explained above, in the form of this embodiment, the structure has constricted portion 200 and capillary tool contact portion 202 of adjacent lands 130 arranged facing each other, so that it is possible to prevent mutual contact between conductor wires 110, and, at the same time, it is possible to maintain gap C between lands 130 at 30 μm or more as a gap that permits etching, while decreasing the arrangement pitch. As a result, it is possible to increase the number of lands 130 with the package size kept as is, so that it is possible to increase the number of pins, and to increase the density of the semiconductor package.

In particular, in the form of this embodiment, lands 130 are arranged offset from each other in the direction orthogonal to the arrangement direction. Consequently, it is possible to ensure that constricted portion 200 and capillary tool contact portion 202 of adjacent lands 130 are reliably arranged to face each other, so as to further increase the arrangement density.

In addition, in the form of this embodiment, lands 130 are all formed in nearly a gourd shape. Consequently, it is possible to increase the arrangement density of lands 130 while preserving the region on land 130 for connection or contact of conductor wire 110. Furthermore, because the width of constricted portion 200 is in the range of 25%–75% the width of capillary tool contact portion 202, it is possible to increase the arrangement density of lands 130 reliably, while effectively maintaining the areas of capillary tool contact portion 202 and wire contact portion 204.

Figure 8:
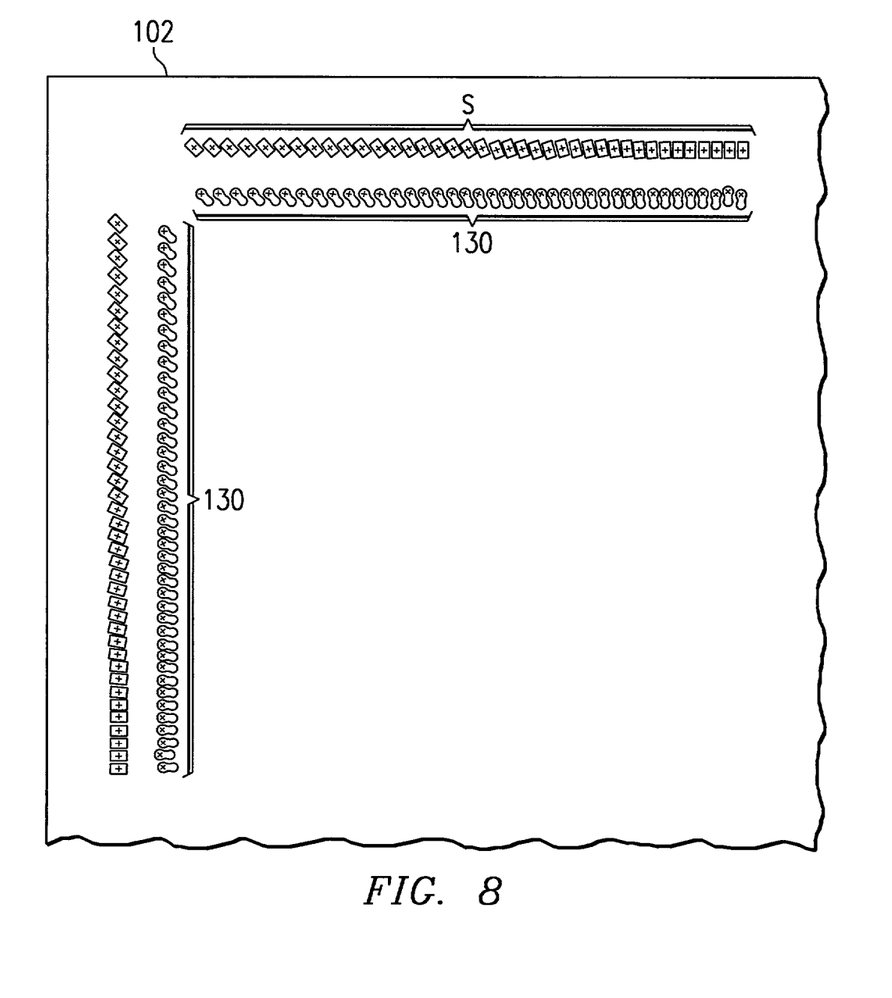
FIG. 8 is a plan view illustrating the arrangement of lands in the semiconductor package in a modified example of Embodiment 1.

In the following, we will examine an example of modification of the form of said embodiment. FIG. 8 is a plan view illustrating the arrangement of lands 130 pertaining to an example of modification of the aforementioned form of the embodiment. It shows a region of about a quarter of the surface of insulating substrate 102. In this example of modification, lands 130 are arranged on the various edges defined along the outer periphery of semiconductor chip 100 (not shown in FIG. 8). Land 130 positioned at the central portion of each edge is arranged with its longitudinal direction orthogonal to the arrangement direction of lands 130, and the nearer the land 130 comes to the end portion of each edge, the more the longitudinal direction becomes slanted away from said orthogonal direction. In this way, due to the inclination of lands 130, a region is created where constricted portion 200 and capillary tool contact portion 202 of adjacent lands 130 are arranged facing each other, it is possible to decrease the arrangement pitch of lands 130.

More specifically, in this modification example, when lands 130 with a width of 0.1 mm are arranged on the periphery of a square semiconductor chip 100 with each edge 13 mm long, the number of lands 130 that can be provided is 316 (79 lands for each edge). For comparison, FIG. 8 illustrates an example in which lands S (with a width of 0.1 mm) that do not have the constricted portion 200 of lands 130 are arranged on the periphery of semiconductor chip 100 with the aforementioned dimensions. In this case, the number of lands that can be provided becomes 308 (77 lands on each edge). That is, when this modification example is adopted for the semiconductor package containing semiconductor chip 100 with said dimensions, it is possible to increase the number of lands that can be arranged by 8.

In this way, in this modification example, it is possible to create a region where constricted portion 200 and capillary tool contact portion 202 of adjacent lands 130 are arranged facing each other. Consequently, it is possible to decrease the arrangement pitch of lands 130 and to increase the arrangement density.

Figure 9A:
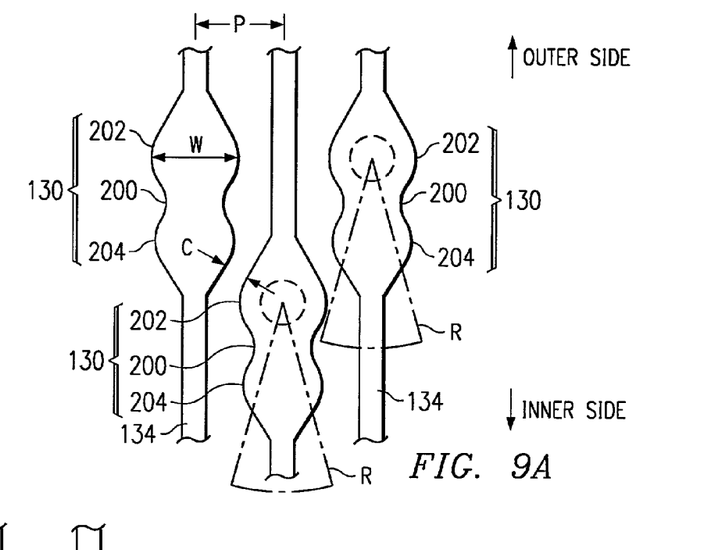
FIG. 9 is a plan view illustrating the arrangement of lands in the semiconductor package in Embodiment 2 of this invention.

In the following, we will examine Embodiment 2 of this invention. FIG. 9(A) is a plan view illustrating the planar shape of lands 130 and their arrangement pattern in Embodiment 2. The shape of lands 130 is identical to that of the form of Embodiment 1. However, lands 130 are positioned offset alternately in the direction orthogonal to the arrangement direction (that is, alternately toward the outer side and the inner side of insulating substrate 102), and they are arranged such that constricted portions 200 of lands 130 positioned on the inner side are respectively arranged facing the leads 134 of lands 130 positioned on the outer side. This arrangement is called a zigzag arrangement. Also, lands 130 are arranged such that constricted portion 200 and wire connection enablement area R of adjacent lands 130 face each other. As a result, it is possible to reduce the arrangement pitch of lands 130. More specifically, when width W of capillary tool contact portion 202 is 0.1 mm, it is possible to reduce the arrangement pitch P of land 130 to 0.109 mm.

Figure 9B:
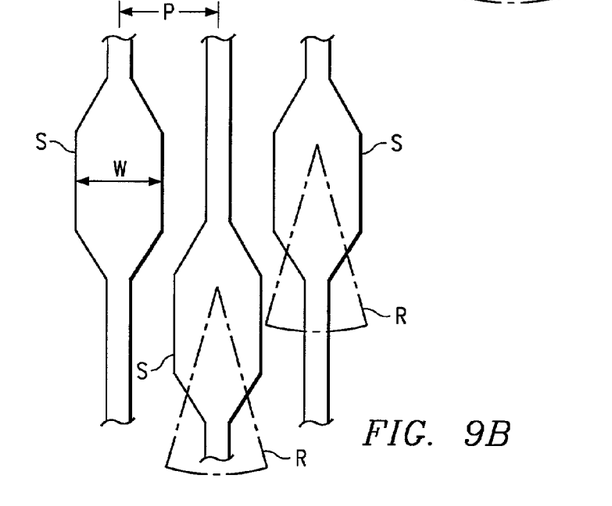

By comparison, FIG. 9(B) illustrates an example of zigzag arrangement of lands S (width of 0.1 mm) not having the constricted portion of lands 130. In this case, arrangement pitch P has to be 0.115 mm or larger if lands S are to be arranged such that wire connection enablement areas R of adjacent lands 130 are not in contact with each other. That is, in the form of this embodiment, the lands arranged in a zigzag arrangement can produce the effect of reducing the arrangement pitch.

In this way, in the form of this embodiment, lands 130 are configured in a zigzag arrangement, and constricted portion 200 and wire connection enablement area R of adjacent lands 130 are arranged facing each other in this constitution. By means of this constitution, it is possible to further increase the arrangement density of lands 130.

Above, forms of embodiments of this invention have been explained with reference to figures. However, this invention is not limited to the particulars of the aforementioned forms of embodiments. As a matter of fact, amendments, improvements, etc. can be made on the basis of the description of the claims. For example, in Embodiment 2, constricted portion 200 may be omitted in lands 130 on the outer side.

As explained above, according to this invention, the constitution provides for the constricted portion and capillary tool contact portion of adjacent lands to be arranged facing each other. Consequently, it is possible to prevent mutual contact between conductor wires, and it is possible to decrease the arrangement pitch of lands while maintaining the gap between lands at a distance that allows etching processing. As a result, it is possible to decrease the arrangement pitch of lands and to increase the arrangement density.

What is claimed is:

1. A semiconductor device, comprising:
   a substrate, comprising:
      plural conductor patterns arranged around a chip-carrying region on a principal surface of said substrate,
      each of said plural conductor patterns having a nearly rectangular land,
      said land having a constricted portion that is formed in the central area of the land with a width smaller than that of the remaining portions of said land,
      said remaining portions of said land comprising a capillary tool contact portion and a wire contact portion arranged on opposing side of said constricted portion;
      adjacent lands of said plural conductor patterns are arranged substantially in parallel such that said capillary tool contact portion of one land is adjacent to said constricted portion of an adjacent land;
   a semiconductor chip that has plural electrode pads on its principal surface and is mounted on the semiconductor chip-carrying region of said substrate,
   plural conductor wires that connect said electrode pads and the lands on said substrate; and a sealant that seals said conductor wires and said semiconductor chip.

2. The semiconductor device described in claim 1, wherein the longitudinal direction of said lands is orthogonal to the direction of arrangement of said plural conductor patterns, and said lands are arranged offset from each other in the direction orthogonal to said arrangement direction.

3. The semiconductor device described an claim 1, wherein the longitudinal directions of said lands are nearly radially arranged with respect to the central portion of said semiconductor chip-carrying region.

4. The semiconductor device described is claim 1, wherein the wire contact portion and said capillary tool contact portion are nearly oval.

5. The semiconductor device described in claim 1, wherein the width of said constricted portion is in the range of 25%–75% the width of said capillary tool contact portion.

* * * * *